(12) United States Patent
Takebayashi et al.

(10) Patent No.: US 12,238,826 B2
(45) Date of Patent: Feb. 25, 2025

(54) SEMICONDUCTOR-MANUFACTURING APPARATUS MEMBER AND METHOD OF MANUFACTURING THE SAME

(71) Applicant: NGK INSULATORS, LTD., Nagoya (JP)

(72) Inventors: Hiroshi Takebayashi, Handa (JP); Joyo Ito, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 799 days.

(21) Appl. No.: 17/465,955

(22) Filed: Sep. 3, 2021

(65) Prior Publication Data

US 2022/0189812 A1 Jun. 16, 2022

(30) Foreign Application Priority Data

Dec. 11, 2020 (JP) ................................ 2020-205755

(51) Int. Cl.
*H05B 3/14* (2006.01)
*H01L 21/683* (2006.01)

(52) U.S. Cl.
CPC ......... *H05B 3/143* (2013.01); *H01L 21/6833* (2013.01)

(58) Field of Classification Search
CPC ......... H01L 21/67103; H01L 21/67109; H01L 21/6831; H01L 21/6833; H01L 21/68735;
(Continued)

(56) References Cited

U.S. PATENT DOCUMENTS 6,280,584 B1 8/2001 Kumar et al.
7,247,818 B2 * 7/2007 Kondou ............ H01L 21/67103
118/725
(Continued)

FOREIGN PATENT DOCUMENTS

JP 2006-196864 A1 7/2006
JP 5666748 B1 2/2015
(Continued)

OTHER PUBLICATIONS

Japanese Office Action (Application No. 2020-205755) dated Jun. 13, 2023 (with English translation) (9 pages).
(Continued)

*Primary Examiner* — Dana Ross
*Assistant Examiner* — James F Sims, III
(74) *Attorney, Agent, or Firm* — BURR PATENT LAW, PLLC (57) ABSTRACT

A semiconductor-manufacturing apparatus member includes an upper plate that has a wafer placement surface having a concave shape or a convex shape, that contains an electrostatic electrode, and that is composed of ceramics; an intermediate plate that is joined to a surface of the upper plate opposite the wafer placement surface with a first metal joining layer interposed therebetween; and a lower plate that is joined to a surface of the intermediate plate opposite the surface that is joined to the upper plate with a second metal joining layer interposed therebetween, wherein a thermal expansion coefficient of the intermediate plate is larger than thermal expansion coefficients of the upper plate and the lower plate.

13 Claims, 5 Drawing Sheets

(58) Field of Classification Search
CPC .......... H01L 21/6875; H01L 21/68785; H05B 3/143; H05B 3/283
USPC .................................................... 219/444.1
See application file for complete search history.

(56) References Cited

U.S. PATENT DOCUMENTS

| | | |
|---|---|---|
| 2006/0169688 A1 | 8/2006 | Mori et al. |
| 2014/0272378 A1 | 9/2014 | Jindo et al. |
| 2015/0077895 A1 | 3/2015 | Jindo et al. |
| 2016/0148812 A1* | 5/2016 | Kang .................. H01L 21/3247 438/795 |
| 2017/0133258 A1* | 5/2017 | Miwa .................. H01L 21/6831 |
| 2018/0108556 A1 | 4/2018 | Takebayashi |
| 2018/0197758 A1* | 7/2018 | Parkhe .............. H01L 21/68785 |
| 2019/0341289 A1 | 11/2019 | Parkhe |
| 2020/0303229 A1 | 9/2020 | Ozaki et al. |

FOREIGN PATENT DOCUMENTS

| | | |
|---|---|---|
| JP | 2018-006737 A | 1/2018 |
| JP | 3222163 U | 7/2019 |
| JP | 6741548 B2 | 7/2020 |
| KR | 10-2020-0051043 A | 5/2020 |

OTHER PUBLICATIONS

Korean Office Action (Application No. 10-2021-0116264) dated Jul. 23, 2023 (with English translation) (11 pages).
Taiwanese Office Action (Application No. 110132810) dated Oct. 11, 2022.

\* cited by examiner

SEMICONDUCTOR-MANUFACTURING APPARATUS MEMBER AND METHOD OF MANUFACTURING THE SAME

BACKGROUND OF THE INVENTION

1. Field of the Invention

The present invention relates to a semiconductor-manufacturing apparatus member and method of manufacturing the same.

2. Description of the Related Art

A known semiconductor-manufacturing apparatus member includes an electrostatic chuck that has a wafer placement surface and that is composed of ceramics and a support substrate having a concave surface that has a depression in the middle unlike the circumference and that is joined to the electrostatic chuck with metal (see, for example, PTL 1). In the semiconductor-manufacturing apparatus member, the electrostatic chuck is joined with the electrostatic chuck deforming into the same shape as the shape of the concave surface of the support substrate. The absolute value of the difference in a thermal expansion coefficient between the ceramics of the electrostatic chuck and a composite material of which the support substrate is composed is equal to or less than $0.2 \times 10^{-6}$/K. It is disclosed that as for the semiconductor-manufacturing apparatus member, the wafer placement surface of the electrostatic chuck has the concave surface, and accordingly, a wafer can be stably held on the wafer placement surface.

CITATION LIST

Patent Literature

PTL 1: JP 6741548 B

SUMMARY OF THE INVENTION

In the case of PTL 1, however, it is difficult to finish the concave surface of the support substrate with precision. For this reason, it is difficult for the wafer placement surface to obtain the concave shape with precise dimensions.

The present invention has been accomplished to solve the problems, and it is a main object of the present invention to provide a semiconductor-manufacturing apparatus member that has a wafer placement surface that has a concave shape or a convex shape with precise dimensions.

A semiconductor-manufacturing apparatus member of the present invention includes:

an upper plate that has a wafer placement surface having a concave shape or a convex shape, that contains an electrostatic electrode, and that is composed of ceramics;

an intermediate plate that is joined to a surface of the upper plate opposite the wafer placement surface with a first metal joining layer interposed therebetween; and a lower plate that is joined to a surface of the intermediate plate opposite the surface that is joined to the upper plate with a second metal joining layer interposed therebetween, wherein a thermal expansion coefficient of the intermediate plate is larger than thermal expansion coefficients of the upper plate and the lower plate.

As for the semiconductor-manufacturing apparatus member, the thermal expansion coefficient of the intermediate plate is larger than the thermal expansion coefficients of the upper plate and the lower plate. For this reason, the wafer placement surface can have the concave shape or the convex shape with precise dimensions by using the difference in thermal expansion between the intermediate plate and the upper plate and the difference in thermal expansion between the intermediate plate and the lower plate.

In the semiconductor-manufacturing apparatus member according to the present invention, the intermediate plate may be composed of a composite material of metal and ceramics or metal, and the lower plate may be composed of the same ceramics as the upper plate and may have a thickness that differs from that of the upper plate. This enables the thermal expansion coefficient of the intermediate plate to be readily adjusted to be larger than the thermal expansion coefficients of the upper plate and the lower plate. In addition, the wafer placement surface can readily have the concave shape or the convex shape because the upper plate and the lower plate are composed of the same ceramics but have the different thicknesses.

In this case, the wafer placement surface may have the concave shape, and the upper plate may be thinner than the lower plate. Alternatively, the wafer placement surface may have the convex shape, and the upper plate may be thicker than the lower plate.

The upper plate, the lower plate, or both may contain a resistance heating element. This enables the semiconductor-manufacturing apparatus member to be used as an electrostatic chuck heater. The lower plate may contain a resistance heating element, and a diameter of a region in which the resistance heating element extends may be equal to or more than a diameter of the upper plate. This enables the resistance heating element to heat the entire wafer placement surface of the upper plate, and accordingly, the thermal uniformity of a wafer increases.

A method of manufacturing a semiconductor-manufacturing apparatus member of the present invention includes:

(a) a step of preparing a lower plate, an upper plate that has a wafer placement surface, that contains an electrostatic electrode, and that is composed of ceramics, and an intermediate plate that has a thermal expansion coefficient larger than those of the upper plate and the lower plate; and (b) a step of obtaining a joined body in a manner in which a first metal joining material is disposed between an upper surface of the intermediate plate and a surface of the upper plate opposite the wafer placement surface, a second metal joining material is disposed between a lower surface of the intermediate plate and an upper surface of the lower plate, heat is added under pressure in this state, and subsequently, temperature is returned to room temperature.

The method of manufacturing the semiconductor-manufacturing apparatus member enables the wafer placement surface to have the concave shape or the convex shape with precision by using the difference in the thermal expansion between the intermediate plate and the upper plate and the difference in the thermal expansion between the intermediate plate and the lower plate that occur at the step (b).

In the method of manufacturing the semiconductor-manufacturing apparatus member according to the present invention, when the lower plate is prepared at the step (a), the lower plate may be processed such that a thickness of the lower plate becomes a predetermined target thickness. The wafer placement surface can have the concave shape or the convex shape with precision in a manner in which the thickness of the lower plate is thus adjusted to be the target thickness before the joined body is obtained.

In the method of manufacturing the semiconductor-manufacturing apparatus member according to the present invention, at the step (b), after the joined body is obtained, the lower plate may be processed such that a thickness of the lower plate becomes a predetermined target thickness that differs from a thickness of the upper plate. The wafer placement surface can have the concave shape or the convex shape with precision in a manner in which the thickness of the lower plate is thus adjusted to be the target thickness before the joined body is obtained.

In the method of manufacturing the semiconductor-manufacturing apparatus member according to the present invention, at the step (b), after the joined body is obtained, a thickness of the lower plate may be adjusted such that a shape of the upper plate becomes a predetermined concave shape or convex shape. This enables the wafer placement surface to have the concave shape or the convex shape with more precision.

DETAILED DESCRIPTION OF THE INVENTION

Figure 1:
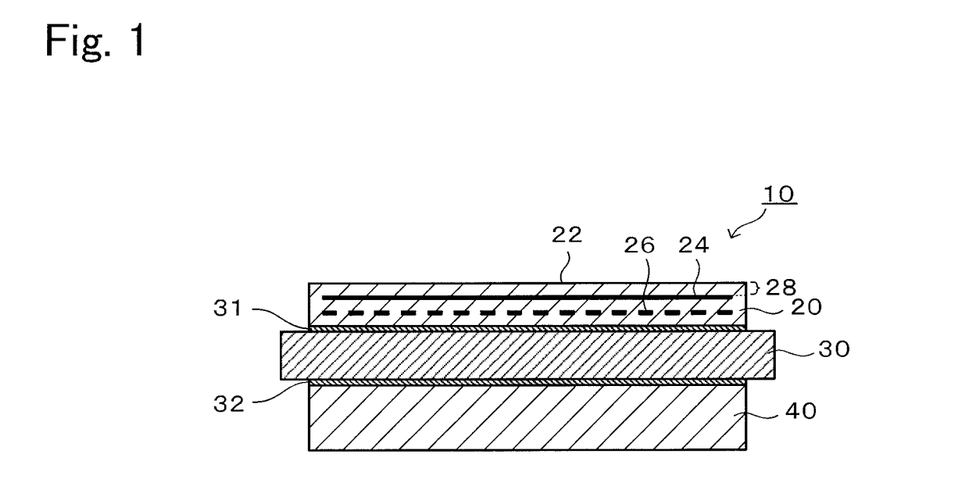
FIG. 1 is a sectional view of a semiconductor-manufacturing apparatus member 10.
Figure 2:
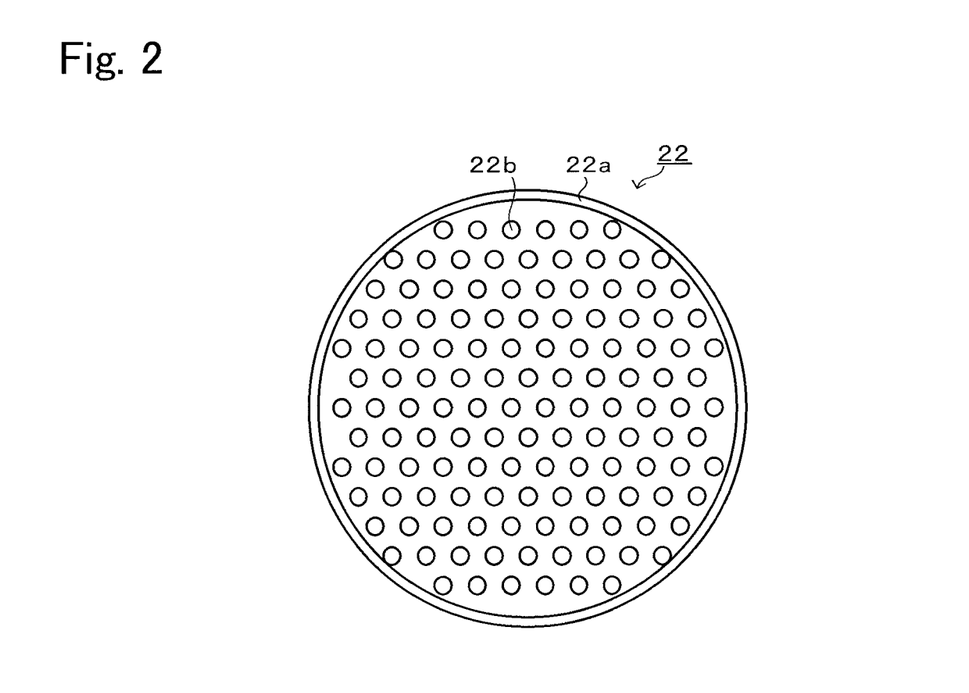
FIG. 2 is a plan view of a wafer placement surface 22.
Figure 3:
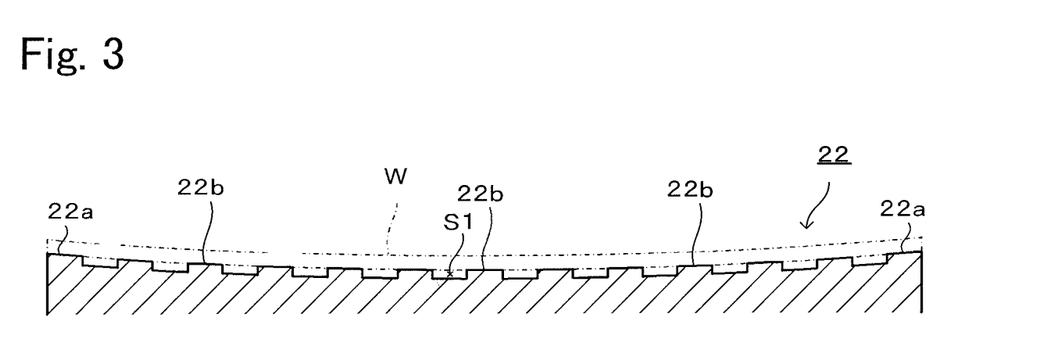
FIG. 3 is an enlarged sectional view of the wafer placement surface 22.

A preferred embodiment of the present invention will now be described with reference to the drawings. FIG. 1 is a sectional view of a semiconductor-manufacturing apparatus member 10 (a sectional view taken along a vertical plane that passes through the center of the member 10). FIG. 2 is a plan view of a wafer placement surface 22. FIG. 3 is an enlarged sectional view of the wafer placement surface 22.

The semiconductor-manufacturing apparatus member 10 includes an upper plate 20, an intermediate plate 30, a lower plate 40, and first and second metal joining layers 31 and 32.

The upper plate 20 is a ceramic (for example, alumina or aluminum nitride) plate that has a disk shape and that has a diameter equal to that of a silicon wafer W on which a plasma process is to be performed and contains an electrostatic electrode 24 and a resistance heating element 26. For this reason, the upper plate 20 functions as an electrostatic chuck and also functions as a heater. For example, the diameter of the upper plate 20 may be, but not particularly limited to, 250 to 350 mm. An upper surface of the upper plate 20 is the wafer placement surface 22.

As illustrated in FIG. 3, the wafer placement surface 22 has a concave shape (a shape having a depression in a middle portion unlike an outer circumferential portion). The wafer W that is placed on the wafer placement surface 22 has a concave shape. That is, the wafer placement surface 22 has a shape following the wafer W that has the concave shape. A depth (also referred to as the difference between the maximum height and the minimum height of the wafer placement surface 22, or flatness) at a position at which the wafer placement surface 22 is depressed most is preferably 1 to 500 μm, more preferably 30 to 300 μm. As illustrated in FIG. 2 and FIG. 3, a seal band 22a is formed on the wafer placement surface 22 along the outer edge, and circular projections 22b are formed over the entire surface. The seal band 22a and the circular projections 22b have the same height, and the height thereof is, for example, several μm to several tens of μm.

The electrostatic electrode 24 is a planar electrode that has a circular shape and that can apply a direct voltage via a power supply terminal, not illustrated, by using an external power supply. A portion of the upper plate 20 between the wafer placement surface 22 and the electrostatic electrode 24 functions as a dielectric layer 28. The thickness of the dielectric layer 28 is adjusted to a predetermined thickness (for example, 50 to 500 μm) in consideration for force for attracting the wafer W. When the direct voltage is applied to the electrostatic electrode 24, the wafer W that is placed on the wafer placement surface 22 is attracted and secured to the wafer placement surface 22. When applying the direct voltage ends, the wafer that is attracted and secured to the wafer placement surface 22 is released. As illustrated in FIG. 3, a back surface of the wafer W that is attracted to the wafer placement surface 22 comes into contact with an upper surface of the seal band 22a and upper surfaces of the circular projections 22b. There are spaces S1 between the back surface of the wafer W and portions of the wafer placement surface 22 on which the seal band 22a and the circular projections 22b are not disposed. A heat-transfer gas (for example, He gas) is supplied to the spaces S1 via a gas supply path that extends through the semiconductor-manufacturing apparatus member 10 in the vertical direction and that is not illustrated. The heat-transfer gas enables the upper plate 20 and the wafer W to efficiently exchange heat. The resistance heating element 26 is formed in a one-stroke pattern so as to extend over the entire upper plate 20, generates heat when a voltage is applied, and heats the wafer W. A region in which the resistance heating element 26 extends has a circular shape in a plan view. The electrostatic electrode 24 and the resistance heating element 26 are parallel to the wafer placement surface 22. As for the word "parallel", the case of being incompletely parallel within tolerance is regarded as being parallel in addition to being completely parallel.

The intermediate plate 30 has a disk shape and has a diameter larger than the diameters of the upper plate 20 and the lower plate 40. The intermediate plate 30 is joined to the surface of the upper plate 20 opposite the wafer placement surface 22 with a first metal joining layer 31 interposed therebetween. The thermal expansion coefficient of the intermediate plate 30 is larger than the thermal expansion coefficients of the upper plate 20 and the lower plate 40. The thermal expansion coefficients may be linear thermal expansion coefficients at, for example, 40 to 570° C. Examples of the material of the intermediate plate 30 include a composite material and metal. An example of the composite material is a ceramics-metal composite material (also referred to as a metal matrix composite (MMC)). Examples of the MMC include a material containing Si, SiC, and Ti (also referred to as SiSiCTi) and a material obtained by impregnating a SiC porous body with Al and/or Si. Examples of the metal include Ti and Mo. A material that has a thermal expansion coefficient larger than the thermal expansion coefficients of the upper plate 20 and the lower plate 40 is selected as the material of the intermediate plate 30.

The lower plate 40 is joined to the surface of the intermediate plate 30 opposite the surface that is joined to the upper plate 20 with a second metal joining layer 32 interposed therebetween. The lower plate 40 may be composed of metal, a MMC, or ceramics and is preferably composed of ceramics. According to the present embodiment, the lower plate 40 is composed of the same material as the ceramics of the upper plate 20, and the upper plate 20 is thinner than the lower plate 40. Consequently, the wafer placement surface 22 of the upper plate 20 has the concave shape. The intermediate plate 30 is preferably thicker than the upper plate 20 and the lower plate 40. For example, the thickness of the upper plate 20 may be no less than 1 mm and no more than 3 mm, the thickness of the lower plate 40 may be no less than 6 mm and no more than 10 mm, and the thickness of the intermediate plate 30 may be more than 10 mm and no more than 20 mm.

When the materials of the upper plate 20 and the lower plate 40 are alumina, the material of the intermediate plate 30 is preferably SiSiCTi or metal Ti. When the materials of the upper plate 20 and the lower plate 40 are aluminum nitride, the material of the intermediate plate 30 is preferably metal Mo or a material obtained by impregnating a SiC porous body with Si. However, the materials are not particularly limited by this combination, provided that the combination of the materials satisfies that the thermal expansion coefficient of the intermediate plate 30 is larger than the thermal expansion coefficients of the upper plate 20 and the lower plate 40.

The first and second metal joining layers 31 and 32 are composed of a material containing Al such as an Al—Si—Mg or Al—Mg material. The thicknesses of the first and second metal joining layers 31 and 32 are not particularly limited but are preferably 1 to 300 μm, more preferably 50 to 150 μm. The outer circumference of the first metal joining layer 31 preferably does not protrude from the outer circumference of the upper plate 20. The outer circumference of the second metal joining layer 32 preferably does not protrude from the outer circumference of the lower plate 40. The first and second metal joining layers 31 and 32 are formed by, for example, TCB (Thermal compression bonding). The TCB is a known method of compressing and joining two members in a state in which the two members to be joined interpose the metal joining materials therebetween and are heated to a temperature equal to or less than the solidus temperature of the metal joining materials.

Figure 4:
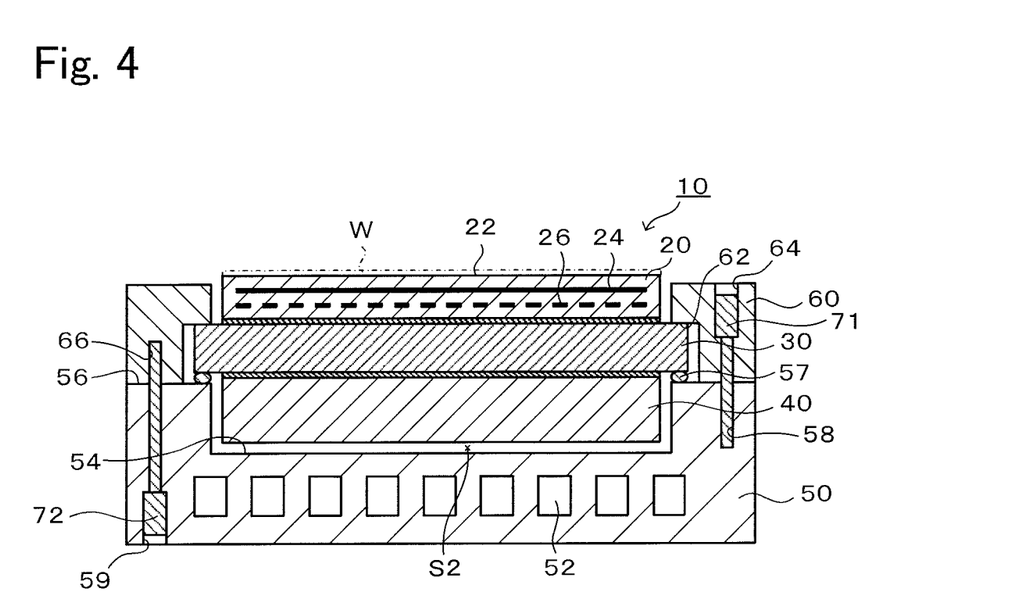
FIG. 4 is a sectional view of the semiconductor-manufacturing apparatus member 10 that is mounted on a cooling device 50.

An example of the use of the semiconductor-manufacturing apparatus member 10 will now be described. FIG. 4 is a sectional view of the semiconductor-manufacturing apparatus member 10 that is mounted on a cooling device 50. The semiconductor-manufacturing apparatus member 10 is mounted on the cooling device 50 that is installed in a vacuum chamber, not illustrated. The cooling device 50 is a disk member composed of metal such as aluminum and contains a refrigerant passage 52 through which refrigerant can circulate. A circular groove 54 is formed at the center of an upper surface of the cooling device 50. The lower plate 40 is inserted in the circular groove 54. The cooling device 50 has an annular surface 56 that surrounds the circumference of the circular groove 54. The semiconductor-manufacturing apparatus member 10 is secured to the cooling device 50 by using a clamp ring 60 in a state in which a seal member 57 that has a ring shape is disposed between an outer circumferential portion of a back surface of the intermediate plate 30 and the annular surface 56, and the lower plate 40 is inserted in the circular groove 54. The outer diameter of the seal member 57 is larger than the diameter of the circular groove 54 and is smaller than the diameter of the intermediate plate 30. An example of the seal member 57 is a metal gasket. The clamp ring 60 is disposed on the annular surface 56 of the cooling device 50. An inner circumferential surface of the clamp ring 60 has a step 62. The step 62 presses an upper surface of an outer circumferential portion of the intermediate plate 30 from above. The clamp ring 60 has vertical holes 64 in which screws 71 can be inserted and screw holes 66 in which screws 72 can be screwed. The screws 71 are inserted in the vertical holes 64 from above and are screwed in screw holes 58 that are formed in the annular surface 56 of the cooling device 50. The screws 72 are inserted in screw insertion holes 59 that extend through the cooling device 50 in the vertical direction from below and are screwed in the screw holes 66 that are formed in a back surface of the clamp ring 60. The multiple (for example, eight) screws 71 and 72 are arranged in the circumferential direction of the clamp ring 60 at regular intervals. Consequently, a space S2 that is surrounded by the circular groove 54, the lower plate 40, and the seal member 57 is sealed. The sealed space S2 is filled with a heat-transfer sheet or heat-transfer gas. The portion of the intermediate plate 30 of the semiconductor-manufacturing apparatus member 10 that protrudes outward from the upper plate 20 and the lower plate 40 is thus used as a flange for mounting on the cooling device 50.

After the semiconductor-manufacturing apparatus member 10 is mounted on the cooling device 50, the wafer W that has the concave shape is placed on the wafer placement surface 22. The pressure of the vacuum chamber is decompressed by a vacuum pump and is adjusted such that a predetermined degree of vacuum is achieved. A direct voltage is applied to the electrostatic electrode 24, and the wafer W is attracted and secured to the wafer placement surface 22. Since the wafer placement surface 22 has the concave shape, the wafer W that has the concave shape comes into close contact with the seal band 22a and the circular projections 22b on the wafer placement surface 22 without a gap, and the spaces S1 are sealed. The heat-transfer gas is supplied to the spaces S1. The heat-transfer gas is enclosed, and accordingly, heat is efficiently conducted between the upper plate 20 and the wafer W. Subsequently, a reactive gas atmosphere at a predetermined pressure (for example, several tens of Pa to several hundreds of Pa) is created in the vacuum chamber. In this state, plasma is generated. The surface of the wafer W is etched by the generated plasma. A controller, not illustrated, controls power that is supplied to the resistance heating element 26 such that the temperature of the wafer W becomes a predetermined target temperature.

An example in which the semiconductor-manufacturing apparatus member 10 is manufactured will now be described. FIGS. 5A to 5D are manufacturing process diagrams of the semiconductor-manufacturing apparatus member 10. In the example described below, the materials of the upper plate 20 and the lower plate 40 are alumina, and the material of the intermediate plate 30 is SiSiCTi.

Figure 5A:
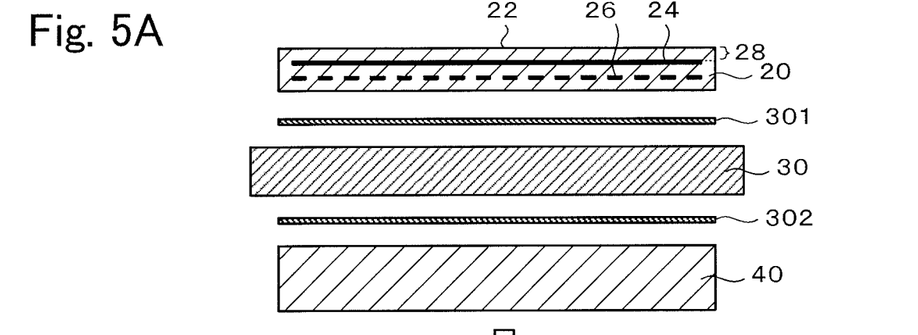
FIGS. 5A to 5D are manufacturing process diagrams of the semiconductor-manufacturing apparatus member 10.
Figure 5B:
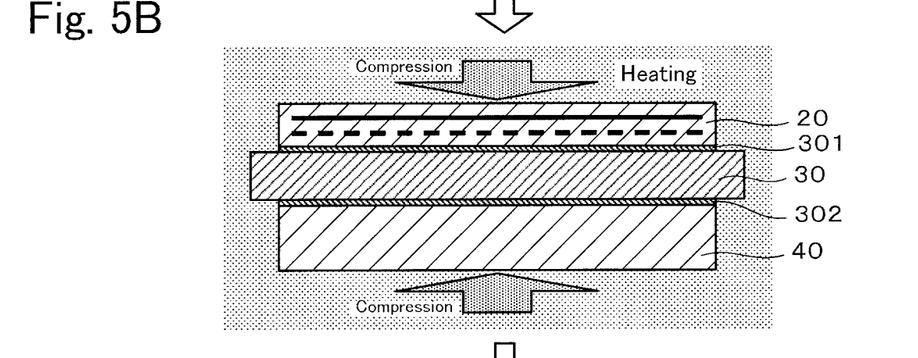

The upper plate 20, the intermediate plate 30, and the lower plate 40 are first prepared (see FIG. 5A). This step is referred to as a step (a).

The upper plate 20 can be manufactured in the following manner. In an example described herein, the upper plate 20 composed of alumina is manufactured. First and second green sheets that have a disk shape and that are composed of alumina are first prepared, the electrostatic electrode 24 is formed on a surface of the first green sheet, and the resistance heating element 26 is formed on a surface of the second green sheet. Examples of a method of forming the electrostatic electrode 24 and the resistance heating element 26 include screen printing, PVD, CVD, and plating. Subsequently, another green sheet (a third green sheet) composed of alumina is stacked on the surface of the first green sheet on which the electrostatic electrode 24 is formed, and the second green sheet is stacked thereon such that the resistance heating element 26 is in contact with the third green sheet, and a multilayer body is obtained. Alternatively, the first green sheet may be disposed on a mold such that the electrostatic electrode 24 faces upward, and alumina granules that are granulated may be spread on the surface on which the electrostatic electrode 24 is formed so as to have a predetermined thickness, the second green sheet may be stacked thereon such that the resistance heating element 26 is in contact with a layer of the alumina granules, and a multilayer body may be obtained by pressing these collectively. Subsequently, the multilayer body is fired by a hot press method, and consequently, an alumina sintered body in which the electrostatic electrode 24 and the resistance heating element 26 are embedded is obtained. The shape and the thickness are adjusted by performing, for example, a grinding process or a blasting process on both surfaces of the obtained alumina sintered body, and the upper plate 20 that has a flat plate shape is obtained (see FIG. 5A). At this time, the process is performed such that the thickness of the dielectric layer 28 is a predetermined thickness, but the seal band 22a and the circular projections 22b are not formed on the wafer placement surface 22. An alumina molded body that is prepared by a casting method (for example, a mold cast method) may be used instead of each alumina green sheet. Alumina sintered bodies may be used instead of the first and second green sheets. An alumina sintered body may be used instead of the third green sheet. Specific conditions in which the upper plate 20 is manufactured may be set by referring conditions disclosed in, for example, Japanese Unexamined Patent Application Publication No. 2006-196864.

The intermediate plate 30 can be manufactured in the following manner. In an example describe herein, the intermediate plate 30 composed of SiSiCTi is manufactured. A disk member composed of SiSiCTi is first prepared. For example, a powder mixture is prepared so as to contain 39 to 51 mass % of silicon carbide material particles that have an average particle diameter of no less than 10 μm and no more than 25 μm and so as to contain one kind or more materials that are selected such that the materials contain Ti and Si, and such that a mass ratio of Si/(Si+Ti) regarding Si and Ti that are derived from materials except for silicon carbide is 0.26 to 0.54. Examples of the materials can be silicon carbide metal Si, and metal Ti. In this case, the materials are preferably mixed such that 39 to 51 mass % of silicon carbide, 16 to 24 mass % of metal Si, and 26 to 43 mass % of metal Ti are contained. Subsequently, a molded body that has a disk shape is prepared from the obtained powder mixture by uniaxial pressing molding, the molded body is sintered at 1370 to 1460° C. in an inert atmosphere by hot pressing, and consequently, the disk member composed of SiSiCTi is obtained. Pressure during the hot pressing is set to, for example, 50 to 300 kgf/cm². Subsequently, the shape and thickness of the obtained disk member are adjusted by, for example, the grinding process, and the intermediate plate 30 is obtained (see FIG. 5A). When the upper plate 20 is composed of alumina, the linear thermal expansion coefficient of alumina at 40 to 570° C. is $7.7 \times 10^{-6}$/K. For this reason, the prepared intermediate plate 30 has a linear thermal expansion coefficient of larger than $7.7 \times 10^{-6}$/K at 40 to 570° C. Specific conditions in which the intermediate plate 30 is manufactured may be set by referring conditions disclosed in, for example, Japanese Patent No. 5666748.

The lower plate 40 can be manufactured in the following manner. In an example described herein, the lower plate 40 composed of alumina is manufactured. An alumina molded body that has a disk shape is manufactured, the alumina molded body is fired to obtain an alumina sintered body, the shape and the thickness are adjusted by performing, for example, the grinding process or the blasting process on both surfaces of the obtained alumina sintered body, and the lower plate 40 that has a flat plate shape is obtained (see FIG. 5A). According to the present embodiment, the thickness of the lower plate 40 is adjusted to a predetermined target thickness (a thickness more than the thickness of the upper plate 20).

Subsequently, a second metal joining material 302 that has the same diameter as the lower plate 40 and that has a flat plate shape is placed on the upper surface of the lower plate 40, the intermediate plate 30 is placed thereon, a first metal joining material 301 that has the same diameter as the upper plate 20 and that has a flat plate shape is placed on the upper surface of the intermediate plate 30, and these are placed such that the surface of the upper plate 20 opposite the wafer placement surface 22 is in contact with the first metal joining material 301. Consequently, a sandwich multilayer body is obtained in a state in which the upper plate 20 and the lower plate 40 sandwiched together with the intermediate plate 30 with the metal joining materials 301 and 302 interposed therebetween. Subsequently, the sandwich multilayer body is compressed at a temperature equal to or less than the solidus temperature of the first and second metal joining materials 301 and 302 (for example, no less than a temperature obtained by subtracting 20° C. from the solidus temperature and no more than the solidus temperature), the upper plate 20, the intermediate plate 30, and the lower plate 40 are joined by the TCB (see FIG. 5B), and subsequently, the temperature is returned to the room temperature. Consequently, a joined body 80 that includes the first metal joining layer 31 composed of the first metal joining material 301 and the second metal joining layer 32 composed of the second metal joining material 302 is obtained (see FIG. 5C). This step is referred to as a step (b). An Al—Mg joining material or an Al—Si—Mg joining material can be used as the first and second metal joining materials 301 and 302. For example, in the case where the Al—Si—Mg joining material (88.5 weight % of Al, 10 weight % of Si, and 1.5 weight % of Mg are contained, and the solidus temperature is about 560° C.) is used for the TCB joining, the upper plate 20 is compressed for several hours at a pressure of 0.5 to 2.0 kg/mm² (for example, 1.5 kg/mm²) in a vacuum atmosphere while being heated to 540 to 560° C. (for example, 550° C.). The first and second metal joining materials 301 and 302 preferably have a thickness of about 100 μm. The wafer placement surface 22 of the upper plate 20 of the joined body 80 has the concave shape because the thermal expansion coefficient of the intermediate plate 30 is larger than the thermal expansion coefficients of the upper plate 20 and the lower plate 40, and the upper plate 20 is thinner than the lower plate 40.

Figure 5C:
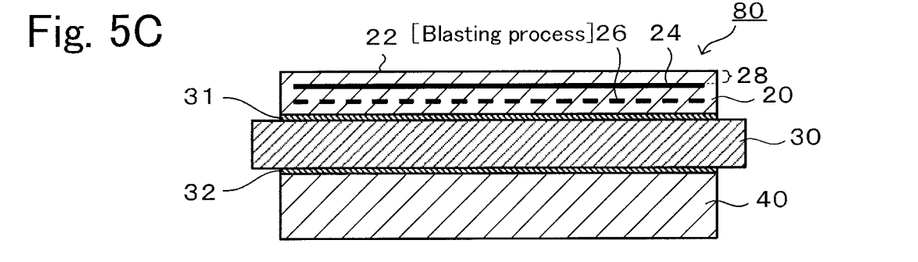
Figure 5D:
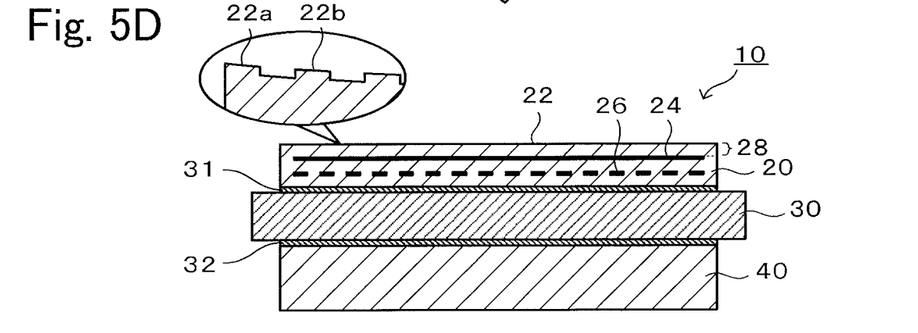

Subsequently, a pattern mask that has holes at positions at which the seal band 22a and circular projections 22b are to be formed is bonded to the wafer placement surface 22 of the upper plate 20 of the joined body 80, and a blasting medium is sprayed for the blasting process (see FIG. 5C). The seal band 22a and the circular projections 22b are formed on the wafer placement surface 22 by the blasting process. Subsequently, the mask is removed, and the semiconductor-manufacturing apparatus member 10 is obtained (see FIG. 5D). A bottom surface of the lower plate 40 may be processed into a flat shape as needed. The thickness of the lower plate 40 may be adjusted by the grinding process such that the concave shape of the wafer placement surface 22 becomes the target concave shape.

As for the semiconductor-manufacturing apparatus member 10 described above in detail, the thermal expansion coefficient of the intermediate plate 30 is larger than the thermal expansion coefficients of the upper plate 20 and the lower plate 40, and accordingly, the wafer placement surface 22 can have the concave shape with precise dimensions by using the difference in thermal expansion between the intermediate plate 30 and the upper plate 20 and the difference in thermal expansion between the intermediate plate 30 and the lower plate 40.

Since the intermediate plate 30 is composed of a composite material of metal and ceramics or metal, and the upper plate 20 and the lower plate 40 are composed of the same ceramics, the thermal expansion coefficient of the intermediate plate 30 can be readily adjusted to be larger than the thermal expansion coefficients of the upper plate 20 and the lower plate 40. Since the upper plate 20 is thinner than the lower plate 40, the wafer placement surface 22 can readily have the concave shape.

In addition, the upper plate 20 contains the electrostatic electrode 24 and the resistance heating element 26. For this reason, the semiconductor-manufacturing apparatus member 10 can be used as an electrostatic chuck heater. The concave shape of the wafer placement surface 22 can be adjusted by the electrostatic electrode 24 and the resistance heating element 26 that are contained in the upper plate 20.

A method of manufacturing the semiconductor-manufacturing apparatus member 10 includes (a) a step of preparing the lower plate 40, the upper plate 20 that has the wafer placement surface 22, that contains the electrostatic electrode 24, and that is composed of ceramics, and the intermediate plate 30 that has a thermal expansion coefficient larger than those of the upper plate 20 and the lower plate 40, and (b) a step of obtaining the joined body in a manner in which the first metal joining material 301 is disposed between the upper surface of the intermediate plate 30 and the surface of the upper plate 20 opposite the wafer placement surface 22, the second metal joining material 302 is disposed between the lower surface of the intermediate plate 30 and the upper surface of the lower plate 40, heat is added under pressure in this state, and subsequently, the temperature is returned to the room temperature. In this way, the wafer placement surface 22 can have the concave shape with precision by using the difference in the thermal expansion between the intermediate plate 30 and the upper plate 20 and the difference in the thermal expansion between the intermediate plate 30 and the lower plate 40 that occur at the step (b).

When the lower plate 40 is prepared at the step (a), the lower plate 40 is processed such that the thickness of the lower plate 40 becomes the target thickness. The wafer placement surface 22 can have the concave shape with precision in a manner in which the thickness of the lower plate 40 is thus adjusted to be the target thickness before the joined body 80 is obtained.

It goes without saying that the present invention is not limited to the embodiment described above at all and can be carried out with various embodiments provided that the embodiments are within the technical range of the present invention.

For example, according to the embodiment described above, at the step (a), the thickness of the lower plate 40 is adjusted to be the target thickness. However, at the step (a), the thickness of the lower plate 40 may be more than the target thickness, and at the step (b), after the joined body 80 is obtained, the lower plate 40 may be processed such that the thickness of the lower plate 40 becomes the target thickness. Also, this enables the wafer placement surface 22 to have the concave shape with precision. Alternatively, at the step (b), after the joined body 80 is obtained, the thickness of the lower plate 40 may be adjusted such that the wafer placement surface 22 has the predetermined concave shape. This enables the wafer placement surface 22 to have the concave shape with more precision.

According to the embodiment described above, the seal band 22a and the circular projections 22b are not formed on the upper plate 20 that is prepared at the step (a). At this time, however, the seal band 22a and the circular projections 22b may be formed on the upper plate 20 by the blasting process.

Figure 6:
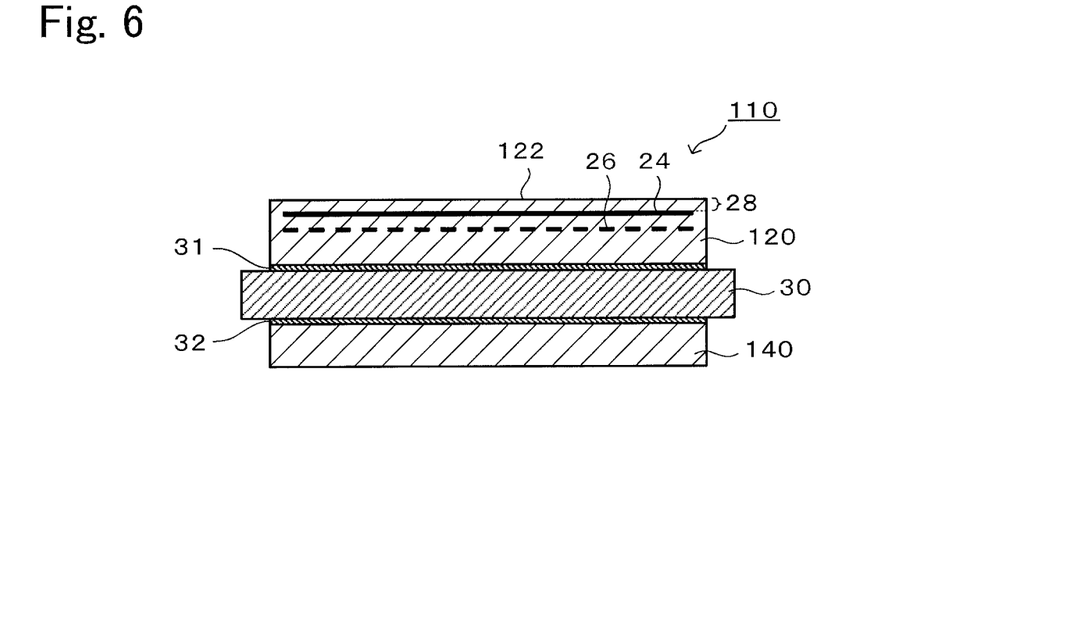
FIG. 6 is a sectional view of a semiconductor-manufacturing apparatus member 110.
Figure 7:
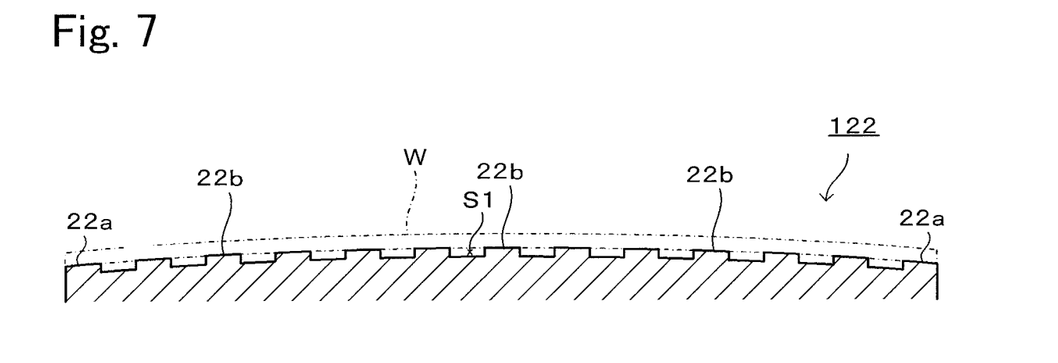
FIG. 7 is an enlarged sectional view of a wafer placement surface 122.

According to the embodiment described above, the wafer placement surface 22 has the concave shape, the upper plate 20 and the lower plate 40 are composed of the same ceramics, and the upper plate 20 is thinner than the lower plate 40. However, this is not a limitation. For example, a wafer placement surface 122 of an upper plate 120 may have a convex shape (a shape having a projection in a middle portion unlike an outer circumferential portion), the upper plate 120 and a lower plate 140 may be composed of the same ceramics, and the upper plate 120 may be thicker than the lower plate 140 as in a semiconductor-manufacturing apparatus member 110 illustrated in FIG. 6 and FIG. 7. In FIG. 6 and FIG. 7, components like to those according to the embodiment described above are designated by like reference characters. In this case, the wafer W that is placed on the wafer placement surface 122 has a convex shape. That is, the wafer placement surface 122 has a shape following the wafer W that has the convex shape. For this reason, the wafer W that has the convex shape is in close contact with the seal band 22a and the circular projections 22b of the wafer placement surface 122 without a gap, and the spaces S1 are sealed. As for the semiconductor-manufacturing apparatus member 110, for example, the thickness of the upper plate 120 may be no less than 3 mm and no more than 5 mm, the thickness of the lower plate 140 may be no less than 1 mm and no more than 3 mm, and the thickness of the intermediate plate 30 may be more than 10 mm and no more than 20 mm.

The semiconductor-manufacturing apparatus member 110 that has the wafer placement surface 122 that has the convex shape can be manufactured in accordance with the manufacturing method according to the embodiment described above. Specifically, when the lower plate 140 is prepared at the step (a), the lower plate 40 is processed such that the thickness of the lower plate 40 becomes the predetermined target thickness (a value smaller than that of the upper plate 120). The wafer placement surface 122 can have the convex shape with precision in a manner in which the thickness of the lower plate 140 is thus adjusted to be the target thickness before the joined body is obtained. Alternatively, at the step (b), after the joined body is obtained, the lower plate 140 may be processed such that the thickness of the lower plate 140 becomes the target thickness (the value smaller than that of the upper plate 120). Also, this enables the wafer placement surface 122 to have the convex shape with precision. At the step (b), after the joined body is obtained, the thickness of the lower plate 140 may be adjusted such that the wafer placement surface 122 has the predetermined convex shape. This enables the wafer placement surface 122 to have the convex shape with more precision. The lower surface of the lower plate 140 may be processed so as to be finally flat.

Figure 8:
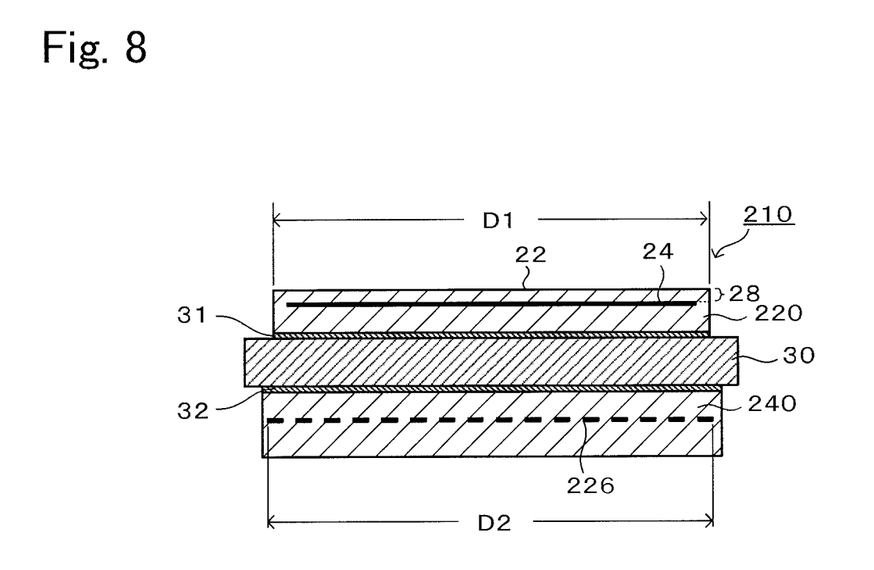
FIG. 8 is a sectional view of a semiconductor-manufacturing apparatus member 210.

According to the embodiment described above, the resistance heating element 26 is embedded in the upper plate 20. However, the resistance heating element 26 may not be embedded in an upper plate 220, but a resistance heating element 226 may be embedded in a lower plate 240 as in a semiconductor-manufacturing apparatus member 210 illustrated in FIG. 8. In this case, the diameter D2 of a region (a circular region in a plan view) in which the resistance heating element 226 is embedded is preferably equal to or more than the diameter D1 of the upper plate 220. This enables the wafer W that has the same diameter as the diameter D1 of the upper plate 220 to be uniformly heated.

According to the embodiment described above, the diameter of the upper plate 20 is equal to the diameter of the wafer W. However, the diameter of the upper plate 20 may be larger than the diameter of the wafer W, or the diameter of the upper plate 20 may be smaller than the diameter of the wafer W.

EXAMPLES

Preferred examples of the present invention will now be described. The present invention is not limited by the examples below at all. Experimental examples 1, 3 to 6, 8 to 11, and 13 to 15 correspond to the examples of present invention, and experimental examples 2, 7, and 12 correspond to comparative examples. The results thereof are illustrated in Table 1.

TABLE 1

| Experimental Example | Material (upper row) and thickness (lower row) | | | Adjustment of the thickness of the lower plate | Wafer suction surface | |
|---|---|---|---|---|---|---|
| | Upper plate | Intermediate plate | Lower plate | | Shape | Flatness |
| 1 | Al$_2$O$_3$ 2 mm | SiSiCTi 15 mm | Al$_2$O$_3$ 8 mm | Before joining | Concave | 0.06 mm |
| 2 | Al$_2$O$_3$ 4 mm | SiSiCTi 15 mm | Al$_2$O$_3$ 4 mm | Before joining | Flat | 0.00 mm |
| 3 | Al$_2$O$_3$ 4 mm | SiSiCTi 15 mm | Al$_2$O$_3$ 2 mm | Before joining | Convex | 0.03 mm |
| 4 | Al$_2$O$_3$ 2 mm | SiSiCTi 15 mm | Al$_2$O$_3$ 8 mm | After joining | Concave | 0.06 mm |
| 5 | Al$_2$O$_3$ 4 mm | SiSiCTi 15 mm | Al$_2$O$_3$ 2 mm | After joining | Convex | 0.03 mm |
| 6 | Al$_2$O$_3$ 2 mm | Ti 15 mm | Al$_2$O$_3$ 8 mm | Before joining | Concave | 0.30 mm |
| 7 | Al$_2$O$_3$ 4 mm | Ti 15 mm | Al$_2$O$_3$ 4 mm | Before joining | Flat | 0.00 mm |
| 8 | Al$_2$O$_3$ 4 mm | Ti 15 mm | Al$_2$O$_3$ 2 mm | Before joining | Convex | 0.15 mm |
| 9 | Al$_2$O$_3$ 2 mm | Ti 15 mm | Al$_2$O$_3$ 8 mm | After joining | Concave | 0.30 mm |
| 10 | Al$_2$O$_3$ 4 mm | Ti 15 mm | Al$_2$O$_3$ 2 mm | After joining | Convex | 0.15 mm |
| 11 | AlN 2 mm | Mo 15 mm | AlN 8 mm | Before joining | Concave | 0.18 mm |
| 12 | AlN | Mo | AlN | Before | Flat | 0.00 mm |
| 13 | AlN 4 mm | Mo 15 mm | AlN 4 mm | Before joining | Convex | 0.09 mm |
| 14 | AlN 2 mm | Mo 15 mm | AlN 8 mm | After joining | Concave | 0.18 mm |
| 15 | AlN 4 mm | Mo 15 mm | AlN 2 mm | After joining | Convex | 0.09 mm |

Experimental Example 1

The upper plate 20 and the lower plate 40 composed of Al$_2$O$_3$ and the intermediate plate 30 composed of SiSiCTi were prepared, and the semiconductor-manufacturing apparatus member 10 according to the embodiment described above was manufactured by the manufacturing method described above. The linear thermal expansion coefficient of Al$_2$O$_3$ at 40 to 570° C. is 7.7×10$^{-6}$/K. The linear thermal expansion coefficient of SiSiCTi at 40 to 570° C. is 7.8×10$^{-6}$/K. Al—Si—Mg joining materials were used as the first and second metal joining materials 301 and 302. The upper plate 20, the intermediate plate 30, and the lower plate 40 were joined by the TCB. The thickness of the upper plate 20 was adjusted to be 2 mm before joining. The thickness of the dielectric layer 28 and the distance from the wafer placement surface 22 to the resistance heating element 26 were constant among all of the experimental examples. The thickness of the intermediate plate 30 and the thickness of the lower plate 40 were adjusted to be 15 mm and 8 mm before joining. Consequently, the obtained semiconductor-manufacturing apparatus member 10 had the wafer placement surface 22 that had the concave shape, and the flatness (the difference between the maximum height and the minimum height of the wafer placement surface 22) of the wafer placement surface 22 was 0.06 mm.

Experimental Example 2

A semiconductor-manufacturing apparatus member was manufactured in the same manner as in the experimental example 1 except that the thicknesses of the upper plate and the lower plate before joining in the experimental example 1 were changed into 4 mm. Consequently, the obtained semiconductor-manufacturing apparatus member had a flat wafer placement surface, and the flatness thereof was 0.00 mm.

Experimental Example 3

A semiconductor-manufacturing apparatus member was manufactured in the same manner as in the experimental example 1 except that the thickness of the upper plate before joining in the experimental example 1 was changed into 4 mm, and the thickness of the lower plate before joining in the experimental example 1 was changed into 2 mm. Consequently, the obtained semiconductor-manufacturing apparatus member had a wafer placement surface that had a convex shape, and the flatness thereof was 0.03 mm.

Experimental Example 4

A semiconductor-manufacturing apparatus member was manufactured in the same manner as in the experimental example 1 except that the thickness of the lower plate before joining in the experimental example 1 was changed into 10 mm, and the lower plate was ground after joining such that the thickness of the lower plate became 8 mm. Consequently, the obtained semiconductor-manufacturing apparatus member had a wafer placement surface that had a concave shape, and the flatness thereof was 0.06 mm.

Experimental Example 5

A semiconductor-manufacturing apparatus member was manufactured in the same manner as in the experimental example 3 except that the thickness of the lower plate before joining in the experimental example 3 was changed into 4 mm, and the bottom surface of the lower plate was ground after joining such that the thickness of the lower plate became 2 mm. Consequently, the obtained semiconductor-manufacturing apparatus member had a wafer placement surface that had a convex shape, and the flatness thereof was 0.03 mm.

Experimental Example 6

A semiconductor-manufacturing apparatus member was manufactured in the same manner as in the experimental example 1 except that the material of the intermediate plate in the experimental example 1 was changed into metal Ti. The linear thermal expansion coefficient of metal Ti at 40 to 570° C. is $11.1 \times 10^{-6}$/K. The obtained semiconductor-manufacturing apparatus member had a wafer placement surface that had a concave shape, and the flatness thereof was 0.30 mm.

Experimental Example 7

A semiconductor-manufacturing apparatus member was manufactured in the same manner as in the experimental example 2 except that the material of the intermediate plate in the experimental example 2 was changed into metal Ti. Consequently, the obtained semiconductor-manufacturing apparatus member had a flat wafer placement surface, and the flatness thereof was 0.00 mm.

Experimental Example 8

A semiconductor-manufacturing apparatus member was manufactured in the same manner as in the experimental example 3 except that the material of the intermediate plate in the experimental example 3 was changed into metal Ti. Consequently, the obtained semiconductor-manufacturing apparatus member had a wafer placement surface that had a convex shape, and the flatness thereof was 0.15 mm.

Experimental Example 9

A semiconductor-manufacturing apparatus member was manufactured in the same manner as in the experimental example 4 except that the material of the intermediate plate in the experimental example 4 was changed into metal Ti. Consequently, the obtained semiconductor-manufacturing apparatus member had a wafer placement surface that had a concave shape, and the flatness thereof was 0.30 mm.

Experimental Example 10

A semiconductor-manufacturing apparatus member was manufactured in the same manner as in the experimental example 5 except that the material of the intermediate plate in the experimental example 5 was changed into metal Ti. Consequently, the obtained semiconductor-manufacturing apparatus member had a wafer placement surface that had a convex shape, and the flatness thereof was 0.15 mm.

Experimental Example 11

A semiconductor-manufacturing apparatus member was manufactured in the same manner as in the experimental example 1 except that the materials of the upper plate and the lower plate in the experimental example 1 were changed into AlN, and the material of the intermediate plate in the experimental example 1 was changed into metal Mo. The linear thermal expansion coefficient of AlN at 40 to 570° C. is $5.9 \times 10^{-6}$/K, and the linear thermal expansion coefficient of metal Mo at 40 to 570° C. is $6.1 \times 10^{-6}$/K. The obtained semiconductor-manufacturing apparatus member had a wafer placement surface that had a concave shape, and the flatness thereof was 0.18 mm.

Experimental Example 12

A semiconductor-manufacturing apparatus member was manufactured in the same manner as in the experimental example 2 except that the materials of the upper plate and the lower plate in the experimental example 2 were changed into AlN, and the material of the intermediate plate in the experimental example 2 was changed into metal Mo. Consequently, the obtained semiconductor-manufacturing apparatus member had a flat wafer placement surface, and the flatness thereof was 0.00 mm.

Experimental Example 13

A semiconductor-manufacturing apparatus member was manufactured in the same manner as in the experimental example 3 except that the materials of the upper plate and the lower plate in the experimental example 3 were changed into AlN, and the material of the intermediate plate in the experimental example 3 was changed into metal Mo. Consequently, the obtained semiconductor-manufacturing apparatus member had a wafer placement surface that had a convex shape, and the flatness thereof was 0.09 mm.

Experimental Example 14

A semiconductor-manufacturing apparatus member was manufactured in the same manner as in the experimental example 4 except that the materials of the upper plate and the lower plate in the experimental example 4 were changed into AlN, and the material of the intermediate plate in the experimental example 4 was changed into metal Mo. Consequently, the obtained semiconductor-manufacturing apparatus member had a wafer placement surface that has a concave shape, and the flatness thereof was 0.18 mm.

Experimental Example 15

A semiconductor-manufacturing apparatus member was manufactured in the same manner as in the experimental example 5 except that the materials of the upper plate and the lower plate in the experimental example 5 were changed into AlN, and the material of the intermediate plate in the experimental example 5 was changed into metal Mo. Consequently, the obtained semiconductor-manufacturing apparatus member had a wafer placement surface that has a convex shape, and the flatness thereof was 0.09 mm.

The present application claims priority of Japanese Patent Application No. 2020-205755 filed on Dec. 11, 2020, the entire contents of which are incorporated herein by reference.

What is claimed is:

1. A semiconductor-manufacturing apparatus member comprising:
    an upper plate that has a wafer placement surface having a concave shape or a convex shape, that contains an electrostatic electrode, and that is composed of ceramics;
    an intermediate plate that is joined to a surface of the upper plate opposite the wafer placement surface with a first metal joining layer interposed therebetween; and
    a lower plate that is joined to a surface of the intermediate plate opposite the surface that is joined to the upper plate with a second metal joining layer interposed therebetween,
    wherein a thermal expansion coefficient of the intermediate plate is larger than thermal expansion coefficients of the upper plate and the lower plate, and
    wherein the intermediate plate is composed of a composite material of metal and ceramics or metal, and the lower plate is composed of a same ceramics as the upper plate and has a thickness that differs from that of the upper plate.

2. The semiconductor-manufacturing apparatus member according to claim 1,
    wherein the wafer placement surface has the concave shape, and the upper plate is thinner than the lower plate.

3. The semiconductor-manufacturing apparatus member according to claim 1,
    wherein the wafer placement surface has the convex shape, and the upper plate is thicker than the lower plate.

4. The semiconductor-manufacturing apparatus member according to claim 1,
    wherein the upper plate, the lower plate, or both contain a resistance heating element.

5. The semiconductor-manufacturing apparatus member according to claim 1,
    wherein the intermediate plate is thicker than the upper plate and the lower plate.

6. The semiconductor-manufacturing apparatus member according to claim 2,
    wherein the upper plate is from 1 mm to 3 mm thick, the lower plate is from 6 to 10 mm thick, and the intermediate plate is from 10 to 20 mm thick.

7. The semiconductor-manufacturing apparatus member according to claim 3,
    wherein the upper plate is from 3 mm to 5 mm thick, the lower plate is from 1 to 3 mm thick, and the intermediate plate is from 10 to 20 mm thick.

8. A semiconductor-manufacturing apparatus member comprising:
    an upper plate that has a wafer placement surface having a concave shape or a convex shape, that contains an electrostatic electrode, and that is composed of ceramics;
    an intermediate plate that is joined to a surface of the upper plate opposite the wafer placement surface with a first metal joining layer interposed therebetween; and
    a lower plate that is joined to a surface of the intermediate plate opposite the surface that is joined to the upper plate with a second metal joining layer interposed therebetween,
    wherein a thermal expansion coefficient of the intermediate plate is larger than thermal expansion coefficients of the upper plate and the lower plate, and
    wherein the lower plate contains a resistance heating element, and a diameter of a region in which the resistance heating element extends is equal to or more than a diameter of the upper plate.

9. A method of manufacturing a semiconductor-manufacturing apparatus member, the method comprising:
    (a) a step of providing a lower plate, an upper plate that has a wafer placement surface, that contains an electrostatic electrode, and that is composed of ceramics, and an intermediate plate that has a thermal expansion coefficient larger than those of the upper plate and the lower plate;
    (b) a step of preparing a joined body in a manner in which a first metal joining material is disposed between an upper surface of the intermediate plate and a surface of the upper plate opposite the wafer placement surface, a second metal joining material is disposed between a lower surface of the intermediate plate and an upper surface of the lower plate,
    (c) a step of heating the joined body under pressure to form a heated joined body, and
    (d) a step of cooling the heated joined body to room temperature to form the semiconductor-manufacturing apparatus member, and
    wherein the intermediate plate is composed of a composite material of metal and ceramics or metal, and the lower plate is composed of a same ceramics as the upper plate and has a thickness that differs from that of the upper plate.

10. The method of manufacturing the semiconductor-manufacturing apparatus member according to claim 9,
    wherein the wafer placement surface has a concave shape, and the upper plate is thinner than the lower plate.

11. The method of manufacturing the semiconductor-manufacturing apparatus member according to claim 9,
    wherein the wafer placement surface has the convex shape, and the upper plate is thicker than the lower plate.

12. The method of manufacturing the semiconductor-manufacturing apparatus member according to claim 9,
    wherein the upper plate, the lower plate or both of step (a) include a resistance heating element.

13. A method of manufacturing a semiconductor-manufacturing apparatus member, the method comprising:
    (a) a step of providing a lower plate, an upper plate that has a wafer placement surface, that contains an electrostatic electrode, and that is composed of ceramics, and an intermediate plate that has a thermal expansion coefficient larger than those of the upper plate and the lower plate;
    (b) a step of preparing a joined body in a manner in which a first metal joining material is disposed between an upper surface of the intermediate plate and a surface of the upper plate opposite the wafer placement surface, a second metal joining material is disposed between a lower surface of the intermediate plate and an upper surface of the lower plate, (c) a step of heating the joined body under pressure to form a heated joined body, and
(d) a step of cooling the heated joined body to room temperature to form the semiconductor-manufacturing apparatus member, and
wherein the lower plate contains a resistance heating element, and a diameter of a region in which the resistance heating element extends is equal to or more than a diameter of the upper plate.

* * * * *